(12) United States Patent
Gaska et al.

(10) Patent No.: US 7,491,626 B2
(45) Date of Patent: Feb. 17, 2009

(54) LAYER GROWTH USING METAL FILM AND/OR ISLANDS

(75) Inventors: Remigijus Gaska, Columbia, SC (US); Jianping Zhang, Lexington, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 18 days.

(21) Appl. No.: 11/424,999

(22) Filed: Jun. 19, 2006

(65) Prior Publication Data

US 2006/0286782 A1 Dec. 21, 2006

Related U.S. Application Data

(60) Provisional application No. 60/692,322, filed on Jun. 20, 2005.

(51) Int. Cl.
*H01L 21/20* (2006.01)

(52) U.S. Cl. .................. 438/483; 438/478

(58) Field of Classification Search ............ 438/478, 438/483
See application file for complete search history.

(56) References Cited

U.S. PATENT DOCUMENTS

| | | | |
|---|---|---|---|
| 4,855,249 A | 8/1989 | Akasaki et al. | |
| 6,673,701 B1 * | 1/2004 | Marsh et al. | 438/493 |
| 6,852,161 B2 | 2/2005 | Urashima et al. | |
| 7,118,929 B2 * | 10/2006 | Frayssinet et al. | 438/22 |
| 2004/0224484 A1 * | 11/2004 | Fareed et al. | 438/478 |

* cited by examiner

*Primary Examiner*—Bradley K Smith
(74) *Attorney, Agent, or Firm*—Hoffman Warnick LLC

(57) ABSTRACT

A solution for manufacturing a nitride-based heterostructure, semiconductor, device, or the like, by growing one or more layers using a metal film and/or nitride islands is provided. In an embodiment of the invention, a group-III nitride film is grown on a surface of a lower layer. The nitride film is grown by first epitaxially growing a group-III metal film on the surface in a substantially nitrogen-free atmosphere. The group-III metal film is grown such that it covers substantially an entire area of the surface. Next, the group-III metal film is nitridated to form a group-III nitride film. This process can be repeated one or more times to form the layer. In another embodiment of the invention, islands are formed on a surface of a lower layer from a group-III nitride film. The islands can be used to subsequent group-III nitride growth to form the group-III nitride layer. The invention provides an improved solution for growing a layer that can be used to generate heterostructures/semiconductors/devices having improved characteristics.

17 Claims, 8 Drawing Sheets

| | |
|---|---|
| Si-DELTA DOPED GaN CHANNEL LAYER | 30 |
| COMPOSITION GRADED BUFFER LAYER FROM AlN TO GaN | 20B |
| AlN NUCLEATION LAYER | 20A |
| INSULATING 4H-SiC SUBSTRATE | 10 |

| | |
|---|---|
| AlGaN CAP LAYER | 34 |
| AlN SPACER LAYER | 32 |
| Si-DELTA DOPED GaN CHANNEL LAYER | 30 |
| COMPOSITION GRADED BUFFER LAYER FROM AlN TO GaN | 20B |
| AlN NUCLEATION LAYER | 20A |
| INSULATING 4H-SiC SUBSTRATE | 10 |

INVENTION
AlN BUFFER

GaN LAYER
Rms = 1.7A

CONVENTIONAL
AlN BUFFER

GaN LAYER
Rms = 5.6A

LAYER GROWTH USING METAL FILM AND/OR ISLANDS

CROSS-REFERENCE TO RELATED APPLICATIONS

The current application claims the benefit of co-pending U.S. Provisional Application No. 60/692,322, titled "Method for Growing Semiconductors Using A Buffer Layer", and filed on Jun. 20, 2005, which is hereby incorporated herein by reference. The current application is related in some aspects to the co-owned, co-pending U.S. Utility application Ser. No. 10/713,326, titled "Methods of Growing Nitride-Based Films Using Varying Pulses", and filed on Nov. 14, 2003, which is hereby incorporated herein by reference.

FIELD OF THE INVENTION

The invention relates generally to generating a nitride-based heterostructure and a nitride-based heterostructure semiconductor, and more particularly, to a solution for growing one or more layers of the heterostructure/semiconductor using a metal film and/or islands.

BACKGROUND OF THE INVENTION

In general, group-III nitride semiconductors (devices) have a direct bandgap structure and a tunable bandwidth between approximately 0.7 and 6.2 electron-Volts (eV). These characteristics make group-III nitride semiconductors attractive for use in various applications in electronics and optoelectronics. However, heteroexpitaxial grown group-III nitride films lack a native crystal nitride, which results in a large lattice mismatch between nitride films and foreign substrates. Additionally, a large interface energy that is present due to the large lattice mismatch makes epitaxial nucleation on the foreign substrate surface difficult ("non-wetting problem"). As a result, the materials grown can be randomly oriented causing a relatively rough surface and, in the worst case, the materials can grow as a polycrystalline material. These shortcomings cause a relatively large number of defects and limit the ability to realize use of group-III nitride semiconductors in most state-of-the-art applications.

Various approaches seek to address epitaxial nucleation on the foreign substrate. In one approach, sapphire is used as the substrate and a low-temperature grown Aluminum Nitride (AlN) or Gallium Nitride (GaN) buffer layer is grown. In particular, the sapphire substrate is heated to 1000-1200 degrees Centigrade (C) to remove surface contamination. The temperature is then reduced to 400-1000 degrees C. and a metalorganic material and a nitrogen source are simultaneously applied to the substrate to form the low-temperature buffer layer. The supply of metalorganic material is then stopped and the temperature is raised to crystallize the low-temperature buffer layer. Subsequently, a desired group-III nitride semiconductor crystal can be epitaxially grown on the buffer layer.

Since low-temperature grown AlN and GaN are amorphous, the buffer layer will not suffer from the non-wetting problem. Additionally, the buffer will provide the desired epitaxial growth for the later high-temperature nitrides growth. However, the low-temperature buffer has a very poor crystalline quality. This results in a large number of defects, many of which extend to the top layers and become a major killing factor for the state-of-the-art nitride devices.

In another approach, group-III metal particles are pre-deposited, nitridated, and used as nucleation sites for following growths. In particular, a sapphire substrate is heated up to 1180 degrees C. in a hydrogen atmosphere and held at that temperature for ten minutes to remove any oxide film from the substrate surface. Subsequently, the temperature is reduced to 1100 degrees C., and in the same hydrogen atmosphere without a nitrogen source, a metalorganic material, trimethyl aluminum (TMA), is supplied to the substrate for one minute at a flow rate of twelve μmol/min. The TMA is thereby thermally decomposed, resulting in the deposition of Al particles on the sapphire substrate. After shutting off the TMA, the temperature is raised to 1180 degrees C. and a nitrogen source, in the form of ammonia ($NH_3$), is supplied for three minutes at a flow rate of 0.2 mol/min, nitridating the Al. Next, with the $NH_3$ flow rate unchanged and the temperature maintained at 1180 degrees C., a metalorganic material, trimethyl gallium (TMG), is supplied at a flow rate of 140 μmol/min causing epitaxial growth of GaN on the substrate with the Al deposition. However, even this approach yields large densities of screw dislocations and other defects.

In view of the foregoing, a need exists to overcome one or more of the deficiencies in the related art.

BRIEF SUMMARY OF THE INVENTION

The invention provides a solution for manufacturing (fabricating, generating, etc.) a nitride-based heterostructure, semiconductor, device, or the like, by growing one or more layers using a metal film and/or nitride islands. In an embodiment of the invention, a group-III nitride film is grown on a surface of a lower layer. The nitride film is grown by first epitaxially growing a group-III metal film on the surface in a substantially nitrogen-free atmosphere. The group-III metal film is grown such that it covers substantially an entire area of the surface. Next, the group-III metal film is nitridated to form a group-III nitride film. This process can be repeated one or more times to form the layer. In another embodiment of the invention, islands are formed on a surface of a lower layer from a group-III nitride film. The islands can be used to subsequent group-III nitride growth to form the group-III nitride layer. The invention provides an improved solution for growing a layer that can be used to generate heterostructures/semiconductors/devices having improved characteristics over previous heterostructures/semiconductors/devices.

A first aspect of the invention provides a method of manufacturing a nitride-based heterostructure, the method comprising: growing a group-III nitride film on a surface of a lower layer, the growing including: epitaxially growing a group-III metal film on the surface in a substantially nitrogen-free atmosphere, wherein the group-III metal film covers substantially an entire area of the surface; and nitridating the group-III metal film to form the group-III nitride film.

A second aspect of the invention provides a method of manufacturing a nitride-based heterostructure, the method comprising: growing a group-III nitride film on a surface of a lower layer; forming islands of the group-III nitride film on the surface; and growing a group-III nitride layer on the surface and the islands.

A third aspect of the invention provides a method of manufacturing a nitride-based device, the method comprising: manufacturing a nitride-based heterostructure, the manufacturing including: growing a group-III nitride film on a surface of a substrate, the growing including: epitaxially growing a group-III metal film on the surface in a substantially nitrogen-free atmosphere, wherein the group-III metal film covers substantially an entire area of the surface; and nitridating the group-III metal film to form the group-III nitride film; growing a graded composition buffer layer on the group-III nitride film; and growing a doped channel layer above the graded composition buffer layer.

A fourth aspect of the invention provides a system for manufacturing a nitride-based heterostructure, the method comprising: a system for growing a group-III nitride film on a surface of a lower layer, the growing including: a system for epitaxially growing a group-III metal film on the surface in a substantially nitrogen-free atmosphere, wherein the group-III metal film covers substantially an entire area of the surface; and a system for nitridating the group-III metal film to form the group-III nitride film.

A fifth aspect of the invention provides a system for manufacturing a nitride-based heterostructure, the method comprising: a system for growing a group-III nitride film on a surface of a lower layer; a system for forming islands of the group-III nitride film on the surface; and a system for growing a group-III nitride layer on the surface and the islands.

A sixth aspect of the invention provides a method of manufacturing a nitride-based device, the method comprising: manufacturing a nitride-based heterostructure, the manufacturing including: growing a group-III nitride film on a surface of a substrate, the growing including: epitaxially growing a group-III metal film on the surface in a substantially nitrogen-free atmosphere, wherein the group-III metal film covers substantially an entire area of the surface; and nitridating the group-III metal film to form the group-III nitride film; growing a graded composition buffer layer on the group-III nitride film; and growing a doped channel layer above the graded composition buffer layer.

The illustrative aspects of the present invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As used herein, unless otherwise noted, it is understood, that Al means Aluminum, C means Carbon, Ga means Gallium, In means Indium, N means Nitrogen, Si means Silicon, and H means Hydrogen. Further, unless otherwise noted, the term "set" means one or more (i.e., at least one) and the phrase "any solution" means any now known or later developed solution.

As indicated above, the invention provides a solution for manufacturing (fabricating, generating, etc.) a nitride-based heterostructure, semiconductor, device, or the like, by growing one or more layers using a metal film and/or nitride islands. In an embodiment of the invention, a group-III nitride film is grown on a surface of a lower layer. The nitride film is grown by first epitaxially growing a group-III metal film on the surface in a substantially nitrogen-free atmosphere. The group-III metal film is grown such that it covers substantially an entire area of the surface. Next, the group-III metal film is nitridated to form a group-III nitride film. This process can be repeated one or more times to form the layer. In another embodiment of the invention, islands are formed on a surface of a lower layer from a group-III nitride film. The islands can be used to subsequent group-III nitride growth to form the group-III nitride layer. The invention provides an improved solution for growing a layer that can be used to generate heterostructures/semiconductors/devices having improved characteristics over previous heterostructures/semiconductors/devices.

Turning to the drawings, FIGS. 1A-D show an illustrative method of growing a group-III nitride layer 20 (FIG. 1D) of a nitride-based heterostructure 2 according to an embodiment of the invention. The group-III nitride layer 20 can comprise any combination of one or more group-III elements and N. For example, group-III nitride layer 20 can comprise at least one of: Al, Ga, and In. Further, group-III nitride layer 20 can comprise substantially uniform molar fraction(s) of the group-III element(s) or can comprise molar fractions that vary along a distance from a surface of a lower layer.

The lower layer can comprise another group-III nitride layer, a substrate, or the like. As shown in FIGS. 1A-D, the group-III nitride layer 20 comprises a buffer layer 20 that is grown on a surface of a substrate 10. To this extent, substrate 10 can comprise any type of substrate, e.g., sapphire, silicon carbide, silicon, a perovskite crystal structure, a porous substrate, and/or the like. However, it is understood that the invention can be used to grow any layer of a nitride-based heterostructure 2.

Figure 1A:
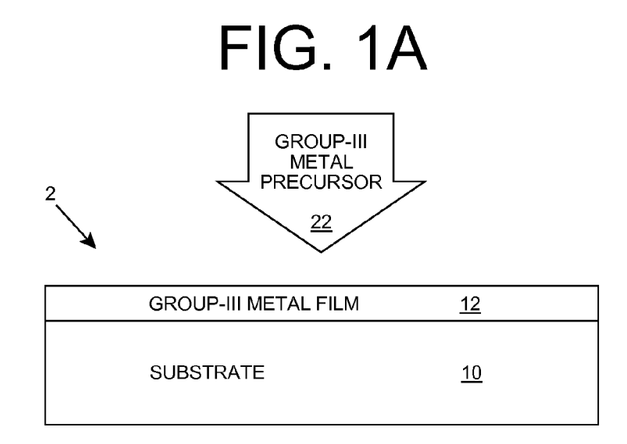
FIGS. 1A-D show an illustrative method of growing a group-III nitride layer of a nitride-based heterostructure according to an embodiment of the invention.

In any event, as shown in FIG. 1A, in a first step, a group-III metal film 12 is deposited on a surface of a lower layer (e.g., substrate 10). For example, group-III metal precursor 22 can be flowed onto the surface and a group-III metal film 12 can be epitaxially grown on the surface. The group-III metal precursor 22 can comprise any known metal precursor for a corresponding group-III metal, such as trimethyl aluminum (TMA), trimethyl indium (TMI), trimethyl gallium (TMG), and/or the like, or any combination thereof. The group-III metal film 12 can substantially comprise one or more group-III metals and/or their alloys (e.g., Al, Ga, In, Al alloy, Ga alloy, In alloy, and/or the like).

During the first step, group-III metal film 12 is grown in an atmosphere that is substantially nitrogen-free (i.e., does not include any Nitrogen source). Further, the atmosphere is such that the group-III metal remains amorphous, thereby enabling epitaxial growth of the group-III metal film 12 on the lower layer, which enables the group-III metal film to reproduce a crystallographic structure of the surface of the lower layer. For example, for an Al film 12, the atmosphere can comprise a temperature that is approximately 800 degrees C. or less. The temperature can be held steady or be adjusted as desired during the processing. Similarly, it is understood that pressure can be adjusted to enable the epitaxial growth.

Additionally, the flow of group-III metal precursor 22 during the first step occurs for a sufficient time to enable group-III metal film to cover at least substantially an entire area of the surface of the lower layer, thereby saturating the surface with the group-III metal/metal alloy. Once a sufficient amount of group-III metal precursor 22 has been flowed/deposited onto the surface, the flow of group-III metal precursor 22 can be stopped. Regardless, the first step will last for a time period to enable group-III metal film to undergo a desired amount of epitaxial growth (with or without the flow of precursor 22 throughout the time period).

It is understood that the flow rate of group-III metal precursor 22 can be varied during the processing of the first step. To this extent, the flow rate of the group-III metal precursor 22 can be pulsed on/off, ramped up/down, and/or the like. Further, while only one group-III metal precursor 22 is shown, it is understood that two or more metal precursors 22 can be flowed during the first step to form a group-III metal film 12 comprising two or more group-III metals/metal alloys (e.g., AlGa, AlIn, GaIn, AlGaIn, and/or the like). To this extent, the flow rates of the corresponding precursors can be adjusted to obtain a desired molar fraction between the two or more metals/metal alloys.

Figure 1B:
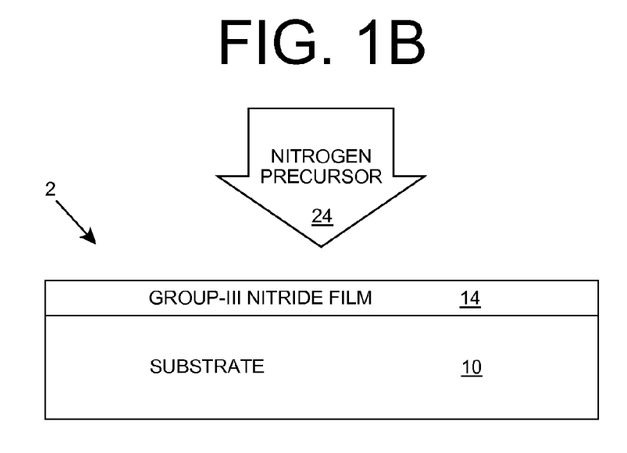

In a second step illustrated in FIG. 1B, group-III metal film 12 (FIG. 1A) is nitridated to form a group-III nitride film 14. In particular, a nitrogen precursor 24 can be provided (e.g., flowed) in an atmosphere that enables the group-III elements in the group-III metal film 12 to bond with the Nitrogen and form group-III nitride molecules (e.g., AlGaN, AlInN, GaInN, AlGaInN, and/or the like). The nitrogen precursor 24 can comprise any Nitrogen precursor, such as ammonia ($NH_3$), and/or the like. The flow of nitrogen precursor 24 can be pulsed on/off, remain constant, adjusted up/down, and/or the like. Before or during the second step, the temperature can be adjusted to facilitate the desired bonding. In one embodiment, the flow of group-III metal precursor 22 (FIG. 1A) is stopped. However, in another embodiment, some flow of group-III metal precursor 22 occurs during the second step (e.g., constant, pulsed, adjusted, and/or the like). In any event, after the second step, the group-III nitride film 14 will at least substantially cover a surface of a lower layer (e.g., substrate 10).

Figure 1C:
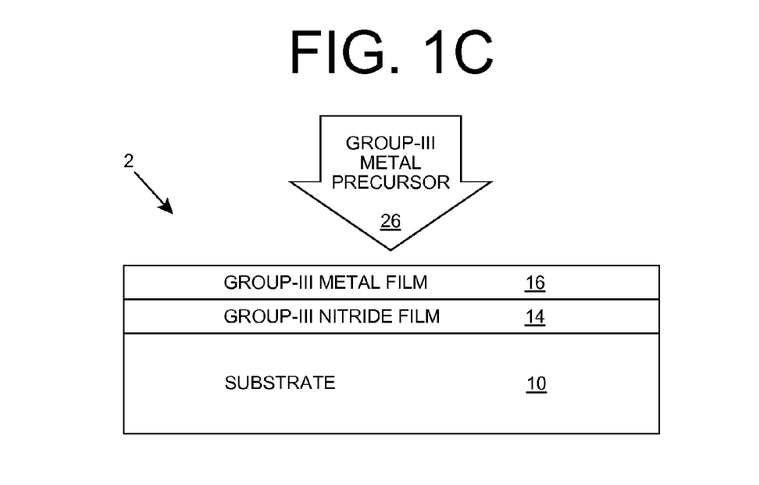
Figure 1D:
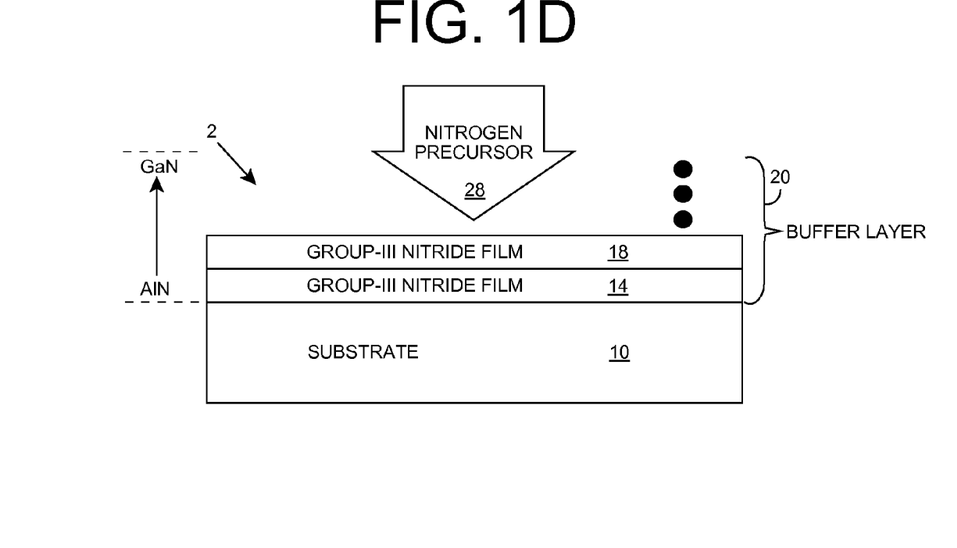

In third and fourth steps illustrated in FIGS. 1C-D, the first and second steps described herein are repeated for a plurality of layers. In particular, in the third step shown in FIG. 1C, a group-III metal film 16 is epitaxially grown on the group-III nitride film 14 using a set of group-III metal precursors 26. Subsequently, in the fourth step shown in FIG. 1D, the group-III metal film 16 (FIG. 1C) is nitridated using a nitrogen precursor 28 to form a group-III nitride film 18. This process can be repeated to form any number of desired nitride films 14, 18, which together form the group-III nitride layer 20 (e.g., buffer layer). By forming layer 20 in this manner, the lateral growth of each nitride film 14, 18 is enhanced, which can result in a high-quality layer 20 for the growth of additional nitride layer(s).

The number of films 14, 18 used to grow layer 20 can be selected based on the content of the lower layer 10 (e.g., substrate), the content of group-III nitride layer 20, a desired content of a top surface of group-III nitride layer 20, a desired thickness of layer 20, and/or the like. To this extent, the relative molar fractions of two or more group-III metals can be adjusted for each film 14, 18. For example, as shown in FIG. 1D, a first film 14 can comprise AlN, a second film can comprise $Al_xGa_yN$, where 0<x, y<1, an a top film (not shown) can comprise GaN. During each intermediate film 18, the molar fractions of Al and Ga (x and y respectively) can be adjusted. For example, the molar fraction of Al (x) can be ramped down from unity (1) in film 14 to zero in the top film, while the molar fraction of Ga (y) can be ramped up from zero in film 14 to unity in the top film. In this case, group-III nitride layer can comprise a content that initially comprises AlN at a bottom surface (adjacent to substrate 10) and gradually transitions to GaN at a top surface, on which additional heterostructure layer(s) can be grown/deposited.

Similarly, a growth temperature for each film 14, 18 can be adjusted to further enhance lateral growth, e.g., by adjusting a temperature of a susceptor. In one embodiment, the growth temperature is ramped from a first temperature that is below a normal growth temperature for the group-III nitride to a second temperature that is substantially near the normal growth temperature for the group-III nitride. In this case, the lower growth temperature for a first film 14 can be selected to maintain a desired amorphous level of the group-III metal and/or nitride to promote the epitaxial growth. Subsequently, in each succeeding film 18, the temperature can be ramped up toward an optimal growth temperature for the group-III metal and/or nitride to enable a higher quality of growth. Alternatively, depending on the composition of the lower layer (e.g., substrate 10) and/or the group-III nitride layer 20, the ramping rate can comprise a negative ramping slope that is initially at a growth temperature that is higher than the normal growth temperature and is incrementally decreased to a growth temperature that is near the normal growth temperature.

It is understood that the steps shown in FIGS. 1A-D are only illustrative and various modifications and/or additions to the steps can be implemented under the invention. For example, one or more of the group-III nitride films in the group-III nitride layer 20 can be grown/deposited using any solution such as Metal Organic Chemical Vapor Deposition (MOCVD), Molecular Beam Epitaxy (MBE), Reactive Molecular-Beam Epitaxy (RMBE), Pulsed Atomic Layer Epitaxy (PALE), and/or the like. In one embodiment, the nitride films are grown/deposited using the method as described in the co-owned, co-pending U.S. Utility application Ser. No. 10/713,326, titled "Methods of Growing Nitride-Based Films Using Varying Pulses", and filed on Nov. 14, 2003, which is hereby incorporated herein by reference, which is referred to herein as Migration Enhanced Metal Organic Chemical Vapor Deposition (MEMOCVD).

Figure 2A:
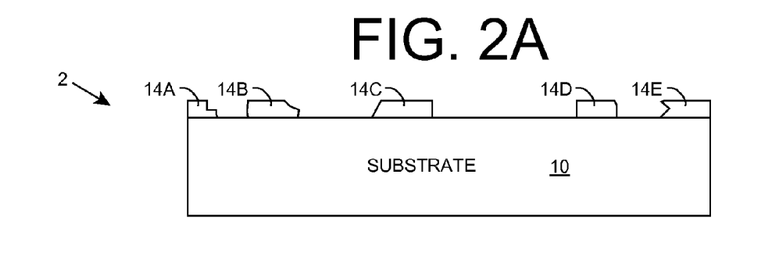
FIGS. 2A-C show another illustrative method of growing a group-III nitride layer of a nitride-based heterostructure according to an embodiment of the invention.
Figure 2B:
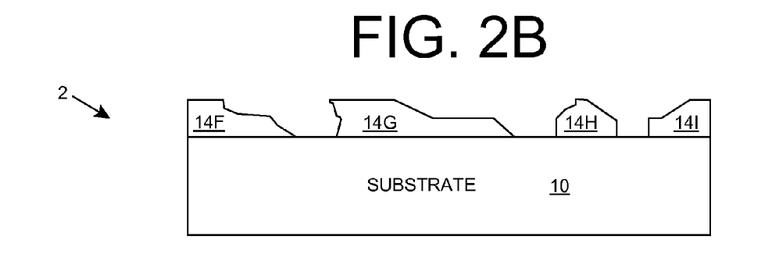
Figure 2C:
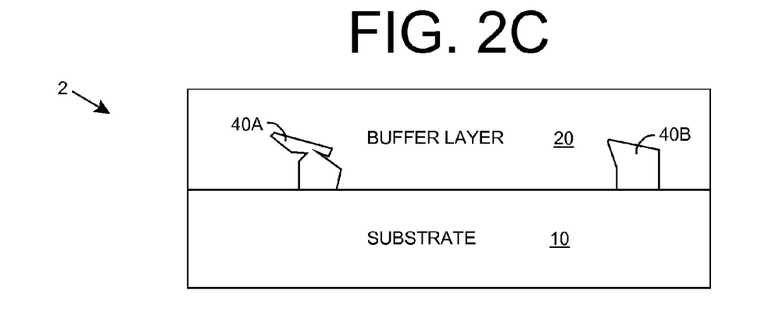

Additionally, FIGS. 2A-C show another illustrative method of growing a group-III nitride layer 20 of a nitride-based heterostructure 2 according to an embodiment of the invention. In particular, after growing the group-III nitride film 14 (FIG. 1B), in a subsequent step shown in FIG. 2A, islands 14A-E are formed from the group-III nitride film 14. For example, for an AlN film 14, the islands 14A-E can be formed by heating a low temperature group-III nitride film 14 from a first temperature (e.g., less than approximately 800 degrees C.) to a second temperature (e.g., greater than approximately 800 (e.g., 1000-1100) degrees C.), which causes the group-III nitride film 14 to crystallize and break into multiple islands 14A-E.

Prior to the heating, growth of the group-III nitride film 14 can be halted. A thickness of group-III nitride film 14 (FIG. 1B) can be selected based on a corresponding desired sizes and/or density of islands 14A-E. In one embodiment, the thickness of group-III nitride film 14 is within a range of approximately half a nanometer (five angstroms) and approximately fifty nanometers. Additionally, the heating can gradually ramp up (e.g., steadily raise the temperature over time) the temperature, anneal, and/or the like, to obtain a desired size/density of islands 14A-E. In one embodiment, in which film 14 comprises AlN and the lower layer comprises a sapphire substrate, each island 14A-E comprises a size that is between approximately five nanometers to approximately five microns.

Islands 14A-E can serve a nucleation points for subsequent growth of layer 20 (FIG. 2C). To this extent, as shown in FIG. 2B, the group-III nitride film growth is repeated for at least one additional layer. Growth of each additional layer can use any solution. In one embodiment, the temperature is held at approximately the normal growth temperature and the additional layer(s) are grown using a high temperature solution, which helps assure a high crystal quality. For example, one or more additional layers can be grown using MEMOCVD. For each layer, the growth occurs both laterally and vertically, thereby causing islands to begin to coalesce after sufficient lateral growth to form fewer, larger islands 14F-I.

This growth process can be continued so that all of the islands 14F-I coalesce to form a group-III nitride layer 20 (e.g., buffer layer) as shown in FIG. 2C. As a result of this process, layer 20 will comprise a top surface with relatively few impurities. Layer 20 can comprise any desired thickness, e.g., between approximately fifty and two hundred nanometers. To this extent, impurities 40A-B that are present at a lower portion of layer 20 are eventually covered due to the strong lateral growth component present during growth of layer 20. During the growth of layer 20, it is understood that the content of layer 20 can be varied in a manner similar to that discussed above. To this extent, the content of layer 20 can comprise $Al_xGa_yIn_zN$, where $0<X, Y, Z \leq 1$, and where one or more of X, Y, Z can vary along a distance of layer 20 from the lower layer 10 (e.g., substrate).

Figure 3:
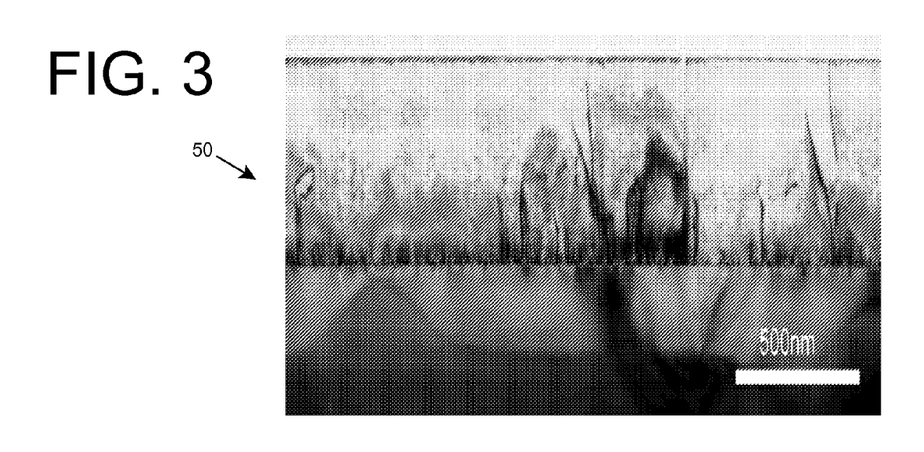
FIG. 3 shows an illustrative image of a buffer layer grown according to an embodiment of the invention.
Figure 4:
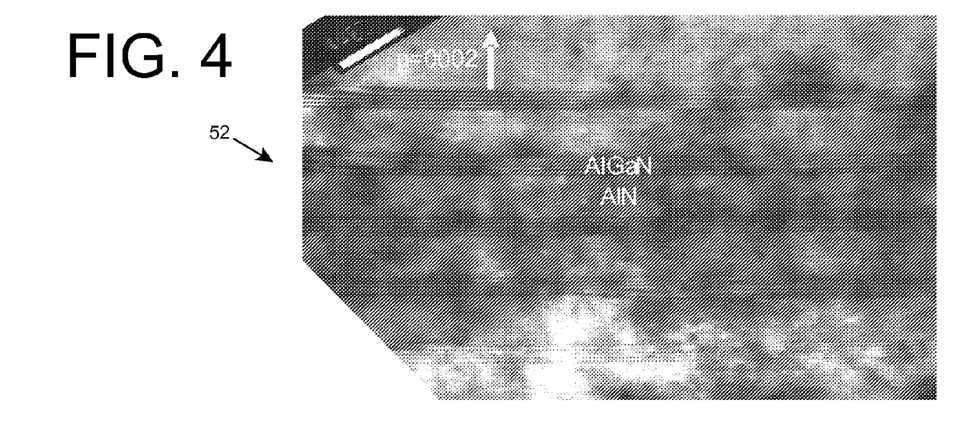
FIG. 4 shows an illustrative image of a heterostructure that includes AlN/AlGaN superlattices having sharp heterointerfaces, which was manufactured according to an embodiment of the invention.

FIG. 3 shows an illustrative Transmission Electron Microscopy (TEM) image 50 of a buffer layer grown according to an embodiment of the invention. As can be seen, a density of impurities, such as screw dislocations, dramatically decreases at a top surface of the buffer layer. After growing the group-III nitride layer 20, various additional processing can be performed to generate heterostructure 2. For example, one or more additional layers can be grown on layer 20 using any solution (e.g., MOCVD, MBE, RMBE, PALE, MEMOCVD, and/or the like. FIG. 4 shows an illustrative TEM image 52 of a heterostructure that includes AlN/AlGaN superlattices having sharp heterointerfaces, which was manufactured according to an embodiment of the invention. In this case, the AlN/AlGaN superlattices were grown on a buffer layer grown according to an embodiment of the invention.

Additionally, multiple short period superlattices (e.g., AlN/AlGaN, AlGaN, AlGaN/AlGaN, GaN/InGaN, GaN/InGaN, AlGaN/AlInGaN, GaN/AlInGaN, InGaN/AlInGaN, and/or the like) can be grown using the buffer layers described herein. In this case, the spacing between the superlattices can vary between approximately ten nanometers and approximately ten microns as shown in image 52. Various layers/structures can be grown on a buffer layer 20 (FIG. 3B) of the current invention including, for example, high temperature AlN, AlGaN, InGaN, AlInGaN, Al/GaN short period superlattices, AlN/AlGaN short period superlattices, AlGaN/AlGaN short period superlattices, GaN/InGaN short period superlattices, GaN/InN short period superlattices, and/or the like.

Figure 5A:
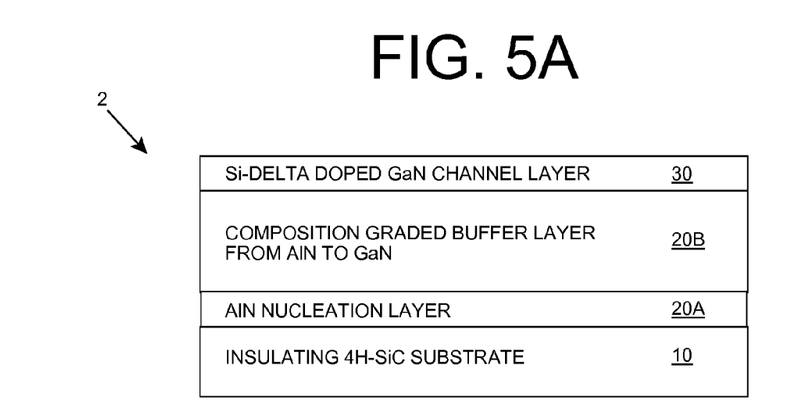
FIGS. 5A-B show method steps for growing a set of active device layers of a nitride-based heterostructure according to an embodiment of the invention.
Figure 5B:
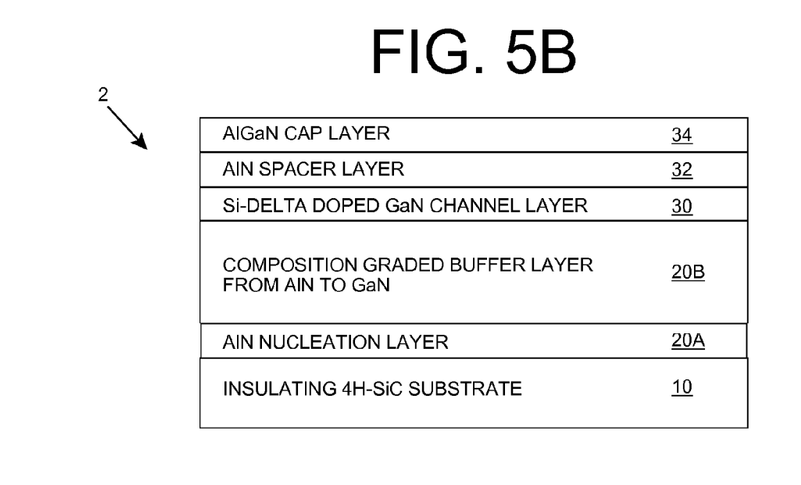

For example, FIGS. 5A-B show method steps for growing a set of active device layers (a device structure) of a nitride-based heterostructure 2 according to an embodiment of the invention. As shown in FIG. 5A, heterostructure 2 includes a compound buffer that includes an AlN nucleation layer 20A grown on an insulating 4H-SiC substrate 10 as discussed herein (e.g., epitaxially growing Al film and then nitridating, with or without repeating one or more times and/or forming islands). Subsequently, a composition graded buffer layer 20B is grown on nucleation layer 20A. As shown, the composition of buffer layer 20B changes from AlN at the interface with nucleation layer 20A to GaN (or alternatively AlGaN) at the interface with the device structure. It is understood that buffer layer 20B is only illustrative of various types of buffer layers 20B that could be grown according to the invention. To this extent, buffer layer 20B can comprise any graded composition of $Al_xGa_yIn_zN$, where $0<X, Y, Z \leq 1$, and where one or more of X, Y, Z varies along a distance of buffer layer 20B from the interface with nucleation layer 20A. Further, buffer layer 20B could comprise short period superlattices, several sequences of short period superlattices with different periods, and/or the like.

Figure 6:
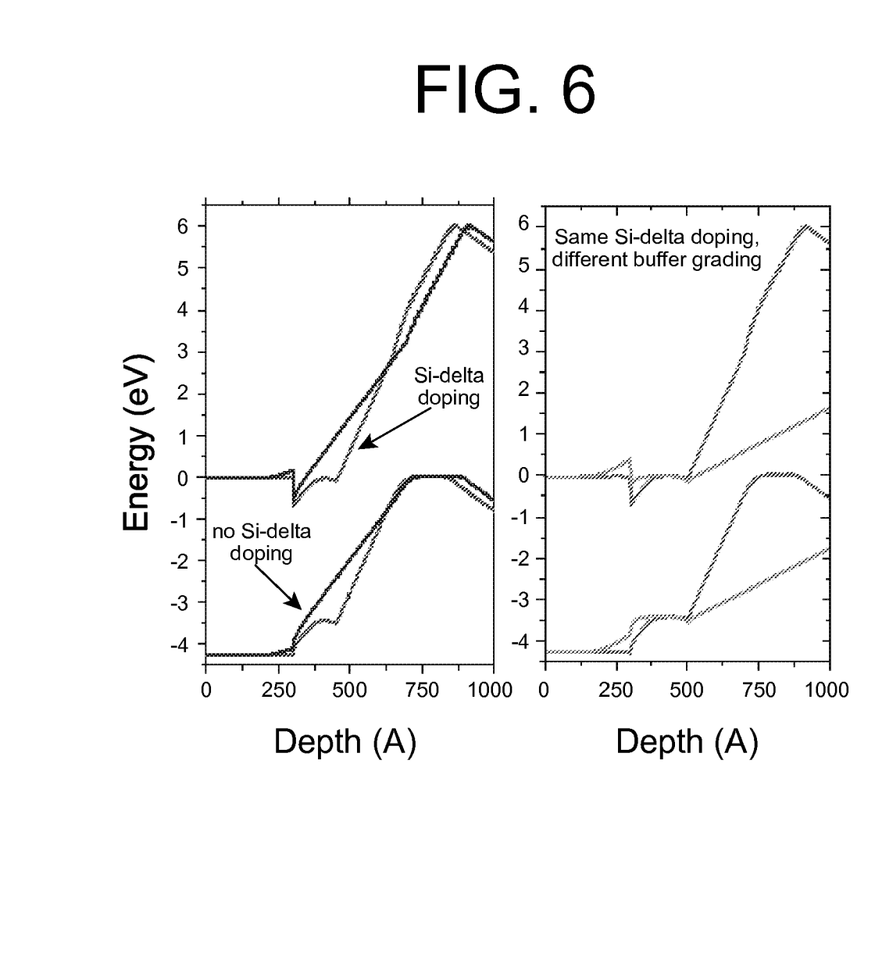
FIG. 6 shows an illustrative pair of simulated band diagrams illustrating the effect of the delta doped silicon layer.
Figure 7:
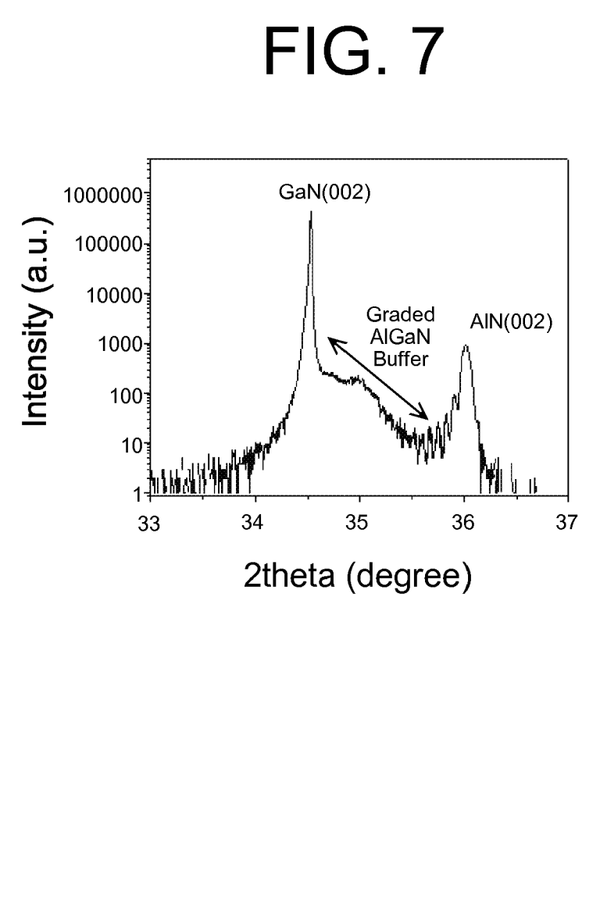
FIG. 7 shows an illustrative X-ray rocking curve of GaN with an AlGaN graded buffer layer grown of an AlN layer.

For the device structure, a Si-delta doped GaN channel layer 30 is grown on buffer layer 20B. The Si-delta doped layer can be used to adjust a charge in the device channel. To this extent, FIG. 6 shows an illustrative pair of simulated band diagrams illustrating the effect of the delta doped silicon layer. Additionally, FIG. 7 shows an illustrative X-ray rocking curve of GaN with an AlGaN graded buffer layer grown of an AlN layer, in which the sharp peaks indicate a high materials quality. Further, the interface between buffer layer 20B and channel layer 30 could comprise a barrier and/or well composition in a short period superlattice that is graded from that of buffer layer 20B to that of the active device layer (channel layer 30).

In FIG. 5B, an AlN spacer layer 32 is grown above the doped GaN channel layer 30, and an AlGaN cap layer 34 is grown above the spacer layer 32. While heterostructure 2 is shown having a particular configuration of layers, it is understood that the composition of each layer/substrate can comprise any composition. Additionally, while channel layer 30 is shown as being doped with a Si-delta dopant, it is understood that any dopant (e.g., delta, modulation, and/or the like) can be used.

Figure 8:
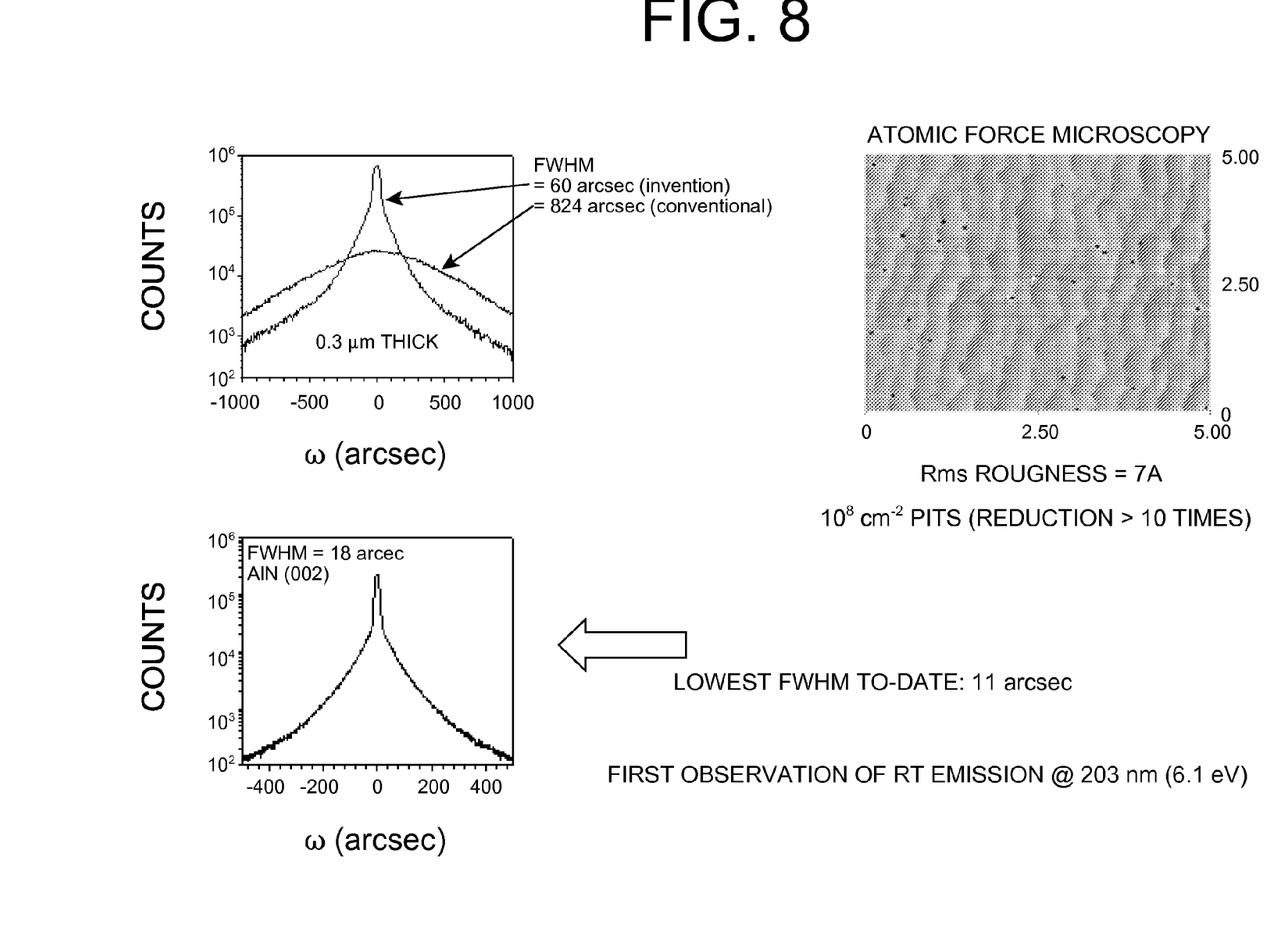
FIGS. 8 and 9 show several illustrative charts and images comparing materials quality of layers grown on a buffer layer of the invention and layers grown on a conventional buffer.
Figure 9:
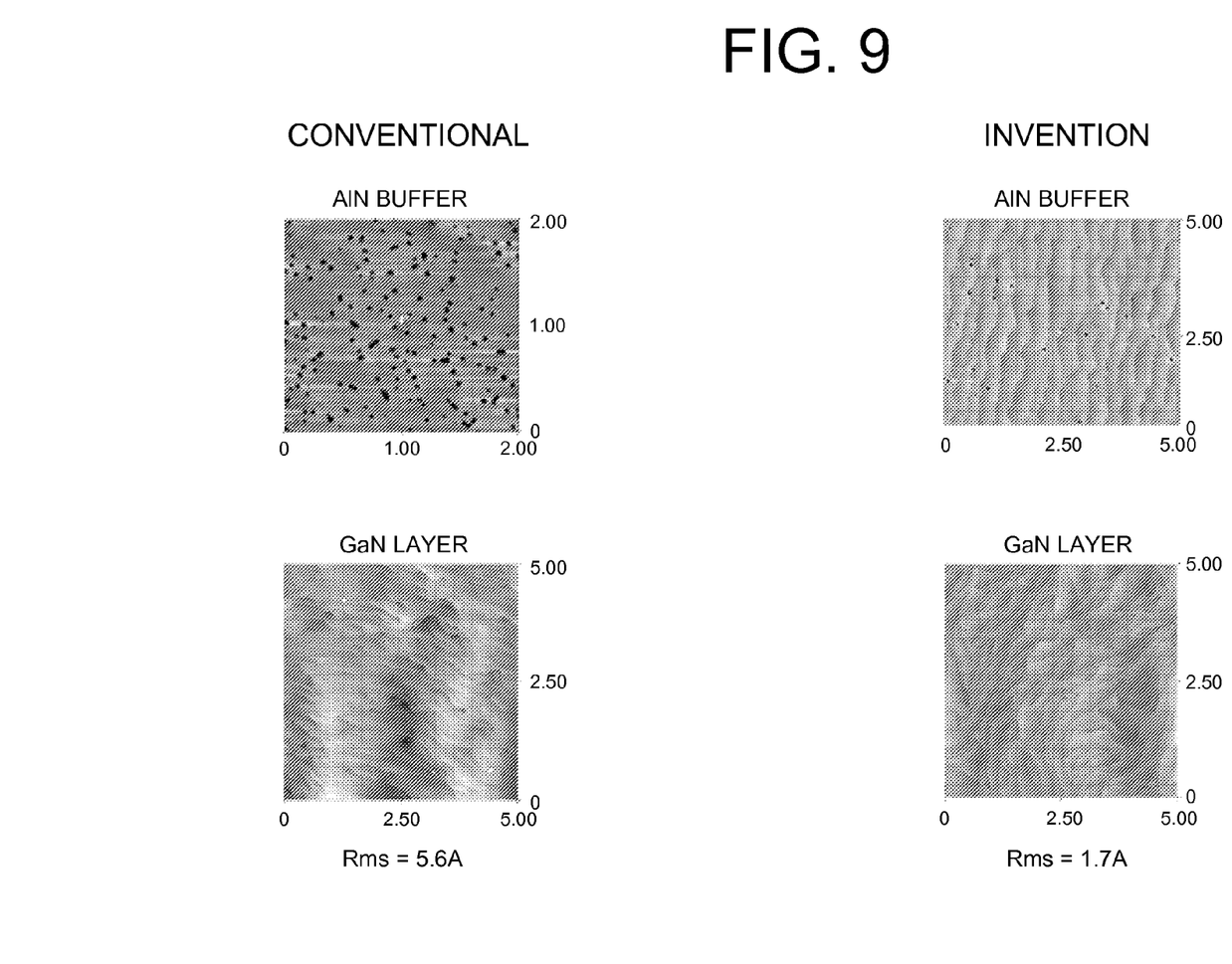

By using the growth method of the current invention to grow a buffer, an improved materials quality of layers grown on the buffer have been obtained. For example, FIG. 8 shows various charts showing the full width at half maximum (FWHM) measures for epitaxial layers grown on a buffer layer of the invention and a layer grown on a conventional buffer. Additionally, FIGS. 8 and 9 show several illustrative atomic force microscopy (AFM) images comparing layers grown on a buffer layer of the invention and layers grown on a conventional buffer. As can be seen, as exhibited by the root mean square (Rms), pits, and FWHM measurements, the layers of the invention provide superior materials quality over conventional layers.

It is understood that the heterostructures shown and described herein are only illustrative. Consequently, a heterostructure manufactured according to the invention can comprise any combination of layer(s) that provide desired performance characteristics of a semiconductor/device to be manufactured using the heterostructure. To this extent, a heterostructure manufactured according to the invention can be used in a method of manufacturing a semiconductor/device. In particular, the heterostructure can be manufactured as described herein. Subsequently, the heterostructure can be processed to manufacture one or more semiconductors/devices. Such processing can include growing/adding one or more layers to the heterostructure, partially/totally removing one or more layers from the heterostructure, adding one or more device components (e.g., contact(s), source/drain/gate, and/or the like) to the heterostructure, and/or the like, to manufacture the desired semiconductor(s)/device(s). Typical semiconductors/devices that can be manufactured using the heterostructures described herein include diodes, transistors, light emitting diodes (LEDs), laser diodes, field effect transistors (FETs), sensors, photodetectors, integrated circuits, optoelectronics components, and surface acoustic wave devices, and/or the like.

Additionally, the various heterostructures shown and described herein can comprise any desired configuration for the resulting semiconductor/device and/or required processing. For example, a buffer layer can be grown as described herein on a patterned substrate. Such a configuration can be used for lateral epitaxial overgrowth, penteoepitaxy, and/or the like processing techniques.

While shown and described herein as a method of manufacturing a heterostructure, semiconductor, device, and/or the like, it is understood that the invention further provides a system for manufacturing a heterostructure, semiconductor, device, and/or the like. To this extent, the system can include any combination of conventional components that are capable of creating and maintaining the atmosphere (e.g., temperature, material sources, pressure, and/or the like). Further, the system can be controlled manually and/or using a computer system that automatically adjusts one or more aspects of the atmosphere according to a defined schedule.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of manufacturing a nitride-based heterostructure, the method comprising:
    growing a group-III nitride film on a surface of a lower layer, the growing including:
        epitaxially growing a group-III metal film directly on the surface in a substantially nitrogen-free atmosphere, wherein the group-III metal film covers substantially an entire area of the surface; and
        after epitaxially growing the group-III metal film, nitridating the group-III metal film to form the group-III nitride film.

2. The method of claim 1, wherein the lower layer comprises a substrate, and wherein the group-III nitride film includes at least one of: Aluminum, Gallium or Indium.

3. The method of claim 1, wherein the epitaxially growing includes:
    flowing a group-III metal precursor on the surface in the substantially nitrogen-free atmosphere;
    enabling the group-III metal film to reproduce a crystallographic structure of the surface; and
    stopping the group-III metal precursor flowing.

4. The method of claim 1, wherein the nitridating includes flowing a nitrogen precursor on the group-III metal film.

5. The method of claim 1, further comprising repeating the growing a group-III nitride film for a plurality of layers.

6. The method of claim 5, further comprising adjusting a growth temperature during the repeating.

7. The method of claim 6, the adjusting including ramping the growth temperature from a first temperature below a normal growth temperature for the group-III nitride to a second temperature that is substantially near the normal growth temperature.

8. The method of claim 5, further comprising adjusting a molar fraction of a group-III metal in the group-III metal film during the repeating.

9. The method of claim 8, the adjusting including ramping the molar fraction for the group-III metal between zero and unity.

10. The method of claim 1, further comprising:
    forming islands of the group-III nitride on the surface from the group-III nitride film; and
    repeating the growing a group-III nitride film for at least one additional layer, wherein the islands coalesce after sufficient lateral growth.

11. The method of claim 10, wherein the forming includes heating the group-III nitride.

12. The method of claim 10, wherein a size of the islands varies from approximately five nanometers to approximately five microns.

13. The method of claim 1, further comprising growing a doped layer above the new layer.

14. The method of claim 1, further comprising growing a set of active device layers above the new layer.

15. A method of manufacturing a nitride-based device, the method comprising:
    manufacturing a nitride-based heterostructure, the manufacturing including:
        growing a group-III nitride film on a surface of a substrate, the growing including:
            epitaxially growing a group-III metal film directly on the surface in a substantially nitrogen-free atmosphere, wherein the group-III metal film covers substantially an entire area of the surface; and
            after epitaxially growing the group-III metal film, nitridating the group-III metal film to form the group-III nitride film;
        growing a graded composition buffer layer on the group-III nitride film; and
        growing a doped channel layer above the graded composition buffer layer.

16. The method of claim 15, the manufacturing the nitride-based heterostructure further comprising growing at least one additional device layer above the doped channel layer.

17. The method of claim 15, further comprising adding at least one device component to the nitride-based heterostructure.

* * * * *